(12) United States Patent
Huang et al.

(10) Patent No.: US 9,748,458 B2
(45) Date of Patent: Aug. 29, 2017

(54) LIGHT EMITTING DIODE MODULE AND METHOD OF MANUFACTURING THE SAME

(71) Applicant: ADVANCED OPTOELECTRONIC TECHNOLOGY, INC., Hsinchu Hsien (TW)

(72) Inventors: Chien-Shiang Huang, Hsinchu (TW); Tzu-Chien Hung, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 44 days.

(21) Appl. No.: 14/834,690

(22) Filed: Aug. 25, 2015

(65) Prior Publication Data
US 2016/0211426 A1    Jul. 21, 2016

(30) Foreign Application Priority Data
Jan. 21, 2015 (CN) .......................... 2015 1 0029220

(51) Int. Cl.
*H01L 21/335* (2006.01)
*H01L 21/8232* (2006.01)
*H01L 33/62* (2010.01)

(52) U.S. Cl.
CPC ...... *H01L 33/62* (2013.01); *H01L 2933/0066* (2013.01)

(58) Field of Classification Search
CPC ......... H01L 24/81; H01L 33/62; H01L 24/17; H01L 33/44; H01L 2924/12041; H01L 2224/16; H01L 2924/01013; H01L 2924/01029; H01L 2924/01033; H01L 2924/01049; H01L 2924/01079; H01L 2924/01082; H01L 2924/01005; H01L 2924/01023; H01L 2924/01
See application file for complete search history.

(56) References Cited

U.S. PATENT DOCUMENTS

| 7,985,006 | B2 | 7/2011 | Chang et al. |
| 2009/0321778 | A1* | 12/2009 | Chen ........................ H01L 24/81 257/99 |
| 2014/0084313 | A1* | 3/2014 | Huang ................ H01L 25/0753 257/88 |

FOREIGN PATENT DOCUMENTS

TW    M382591 U1    6/2010

* cited by examiner

*Primary Examiner* — Charles Garber
*Assistant Examiner* — Abdulfattah Mustapha
(74) *Attorney, Agent, or Firm* — Steven Reiss

(57) ABSTRACT

A light emitting diode module includes a substrate, a first soldering section, a second soldering section, a block and a light emitting diode die. The substrate has a top surface and includes a circuit structure. The block is formed on the top surface. The soldering section and the second solder section are formed on the top surface of the substrate and electrically connected with the circuit structure. The block is positioned between the first soldering section and the second solder section. A height of the block is larger than thicknesses of the first soldering section and the second soldering section. The light emitting diode die includes a first electrode and a second electrode being respectively electrically connected to the first soldering section and the second soldering section. The block is positioned between the first soldering section and the second soldering section.

4 Claims, 5 Drawing Sheets

LIGHT EMITTING DIODE MODULE AND METHOD OF MANUFACTURING THE SAME

CROSS-REFERENCE TO RELATED APPLICATIONS

This application claims priority to Chinese Patent Application No. 201510029220.1 filed on Jan. 21, 2015, the contents of which are incorporated by reference herein.

FIELD

The subject matter relates to a light emitting diode module and a method of manufacturing the light emitting diode module.

BACKGROUND

A light emitting diode (LED) die with electrodes is typically electrically connected to a substrate with circuit structure by a die attaching material. An amount of the die attaching material affects the electric connectivity between the LED die and the circuit structure of the board.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

Figure 1:
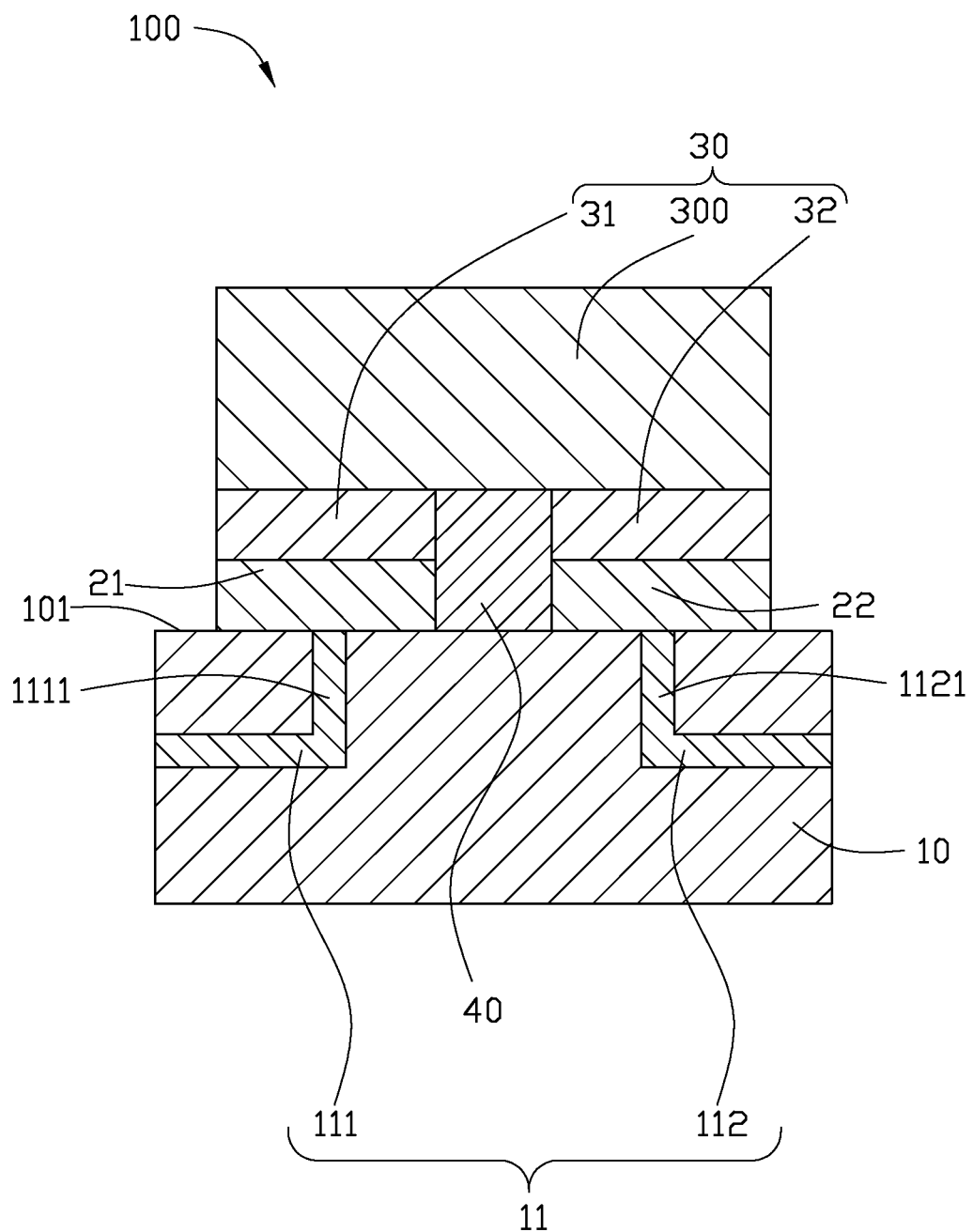
FIG. 1 is cross sectional view showing a light emitting diode module in accordance with an exemplary embodiment of the present disclosure.

FIG. 1 illustrates a light emitting diode module 100 as described by the present disclosure. The light emitting diode module 100 includes a substrate 10, a first soldering section 21, a second soldering section 22, a light emitting diode die 30 and a block 40.

The substrate 10 includes a circuit structure 11. The circuit structure 11 includes a first connecting element 111 and a second connecting element 112. The first connecting element 111 and the second connecting element 112 are insulated from each other. Both of the first connecting element 111 and the second connecting element 112 are formed in the substrate 10. The substrate 10 has a top surface 101. The first connecting element 111 defines a first extending portion 1111. The first extending portion 1111 extends to and exposes on the top surface 101 of the substrate 10. The second connecting element 112 defines a second extending portion 1121. The second extending portion 1121 extends to and exposes on the top surface 101 of the substrate 10. The substrate 10 can be made of a material having heat conduction capability.

The block 40 is formed on the top surface 101 of the substrate 10. The block 40 can be made of carbon oxide. In at least one embodiment, the block 40 can be made of epoxy resin. In at least one embodiment, a height of the block 40 can be larger than or equal to 5 micrometers.

The first soldering section 21 and the second soldering section 22 are formed on the top surface 101 of the substrate 10. The first soldering section 21 and the second soldering section 22 are spaced from each other. The block 40 is positioned between the first soldering section 21 and the second soldering section 22. In at least one embodiment, the first soldering section 21 is electrically connected to the first extending portion 1111, and the second soldering section 22 is electrically connected to the second extending portion 1121. The first soldering section 21 and the second soldering section 22 are made of a material for bonding a die. The height of the block 40 is larger than thicknesses of the first soldering section 21 and the second soldering section 22.

The light emitting diode die 30 is formed on the block 40. The light emitting diode die 30 includes a main body 300, a first electrode 31 and a second electrode 32. In at least one embodiment, the main body 300 can include an N-type semiconductor layer, an active layer and a P-type semiconductor layer (not shown). The main body 300 can further include other structures (not shown), such as an insulating structure. The insulating structure can include a plurality of through holes. A conductive material can fill in the through holes to make the N-type semiconductor layer and the P-type semiconductor layer to be electrically connected with the first electrode 31 and the second electrode 32. The insulating structure can avoid a short circuit generated between the N-type semiconductor layer and the P-type semiconductor layer. The conductive material can be made of nickel, silver, platinum, chromium, gold or other alloy materials. The first electrode 31 and the second electrode 32 are spaced from each other. The first electrode 31 faces the first soldering section 21, and the second electrode 32 faces the second soldering section 22. The first electrode 31 and the second electrode 32 are respectively directly electrically connected with the first soldering section 21 and the second soldering section 22. The block 40 is positioned between the first electrode 31 and the second electrode 32.

Referring to FIGS. 2-5, a method of manufacturing a light emitting diode module 100 is also provided in the present disclosure.

Figure 2:
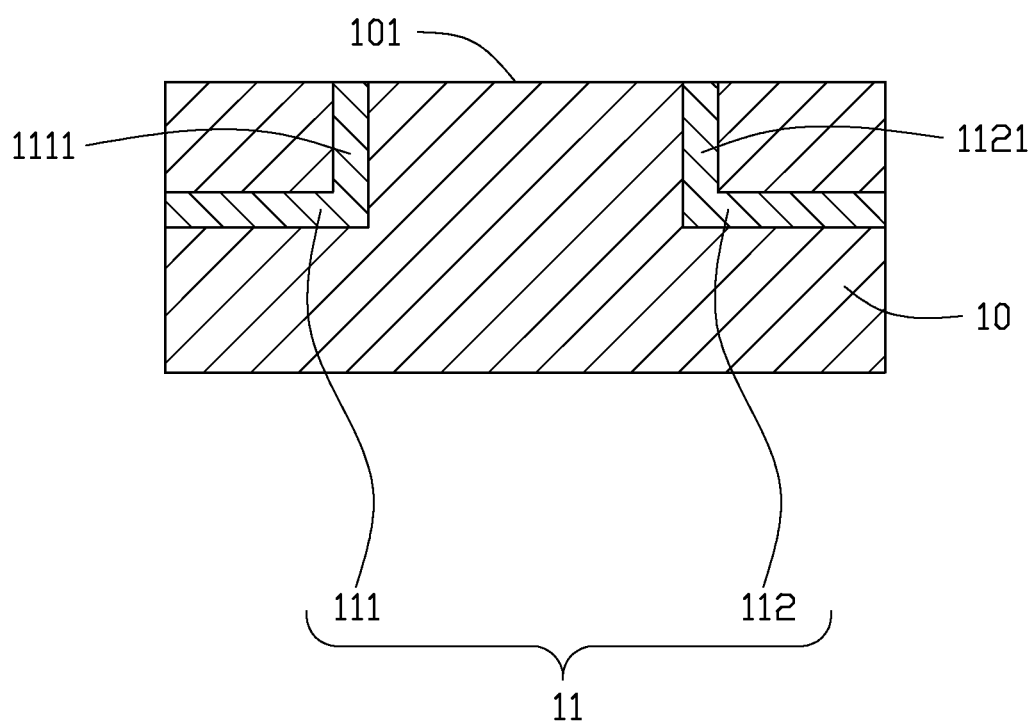
FIG. 2 is a cross sectional view showing a semi-finished light emitting diode module processed by "providing a substrate having a top surface and comprising a circuit structure" of a method of manufacturing a light emitting diode module in accordance with an embodiment of the present disclosure.

A substrate 10 is provided, illustrated in FIG. 2. The substrate 10 has a top surface 101 and includes a circuit structure 11.

Figure 3:
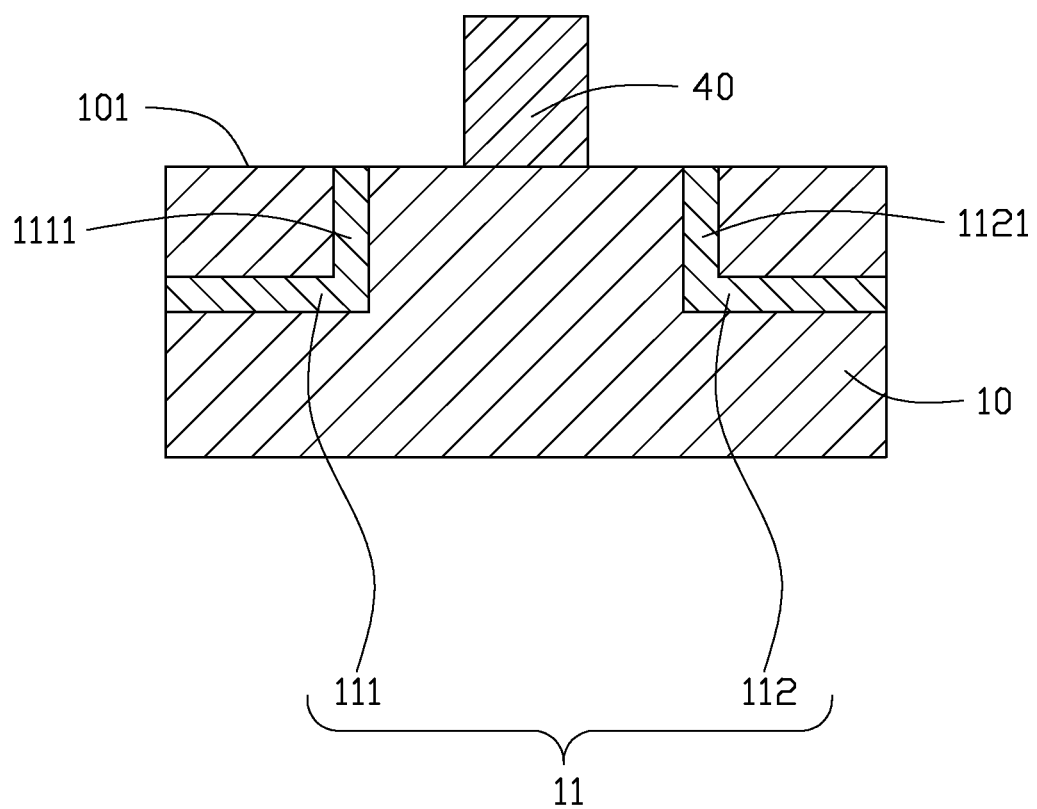
FIG. 3 is a cross sectional view showing a semi-finished light emitting diode module processed by "forming a block on the top surface of the substrate" of a method of manufacturing a light emitting diode module in accordance with an embodiment of the present disclosure.

A block 40 is formed on the top surface 101 of the substrate 10, illustrated in FIG. 3.

Figure 4:
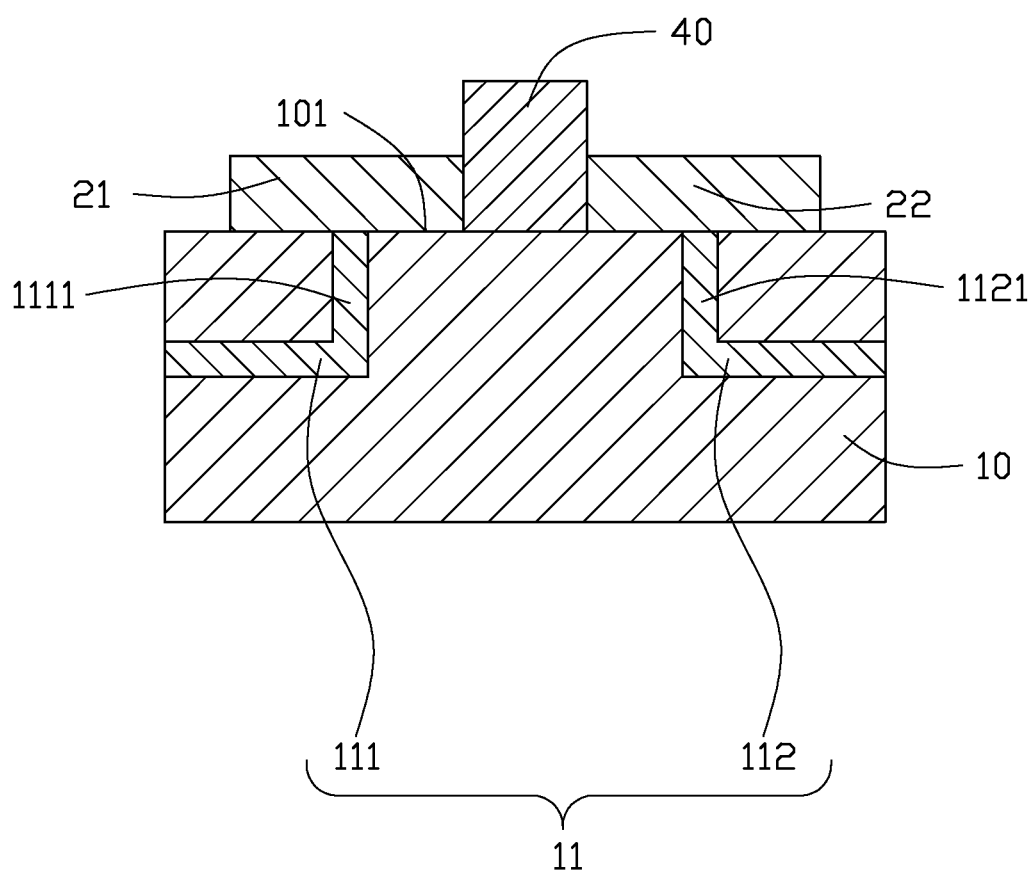
FIG. 4 a cross sectional view showing a semi-finished light emitting diode module processed by "forming a first soldering section and a second soldering section on the top surface of the substrate" of a method of manufacturing a light emitting diode module in accordance with an embodiment of the present disclosure.

A first soldering section 21 and a second soldering section 22 are formed on the top surface 101 of the substrate 10, illustrated in FIG. 4. The block 40 is positioned between the first soldering section 21 and the second soldering section 22. The first soldering section 21 and the second soldering section 22 are electrically connected to the circuit structure 11. A height of the block 40 is larger than thicknesses of the first soldering section 21 and the second soldering section 22.

Figure 5:
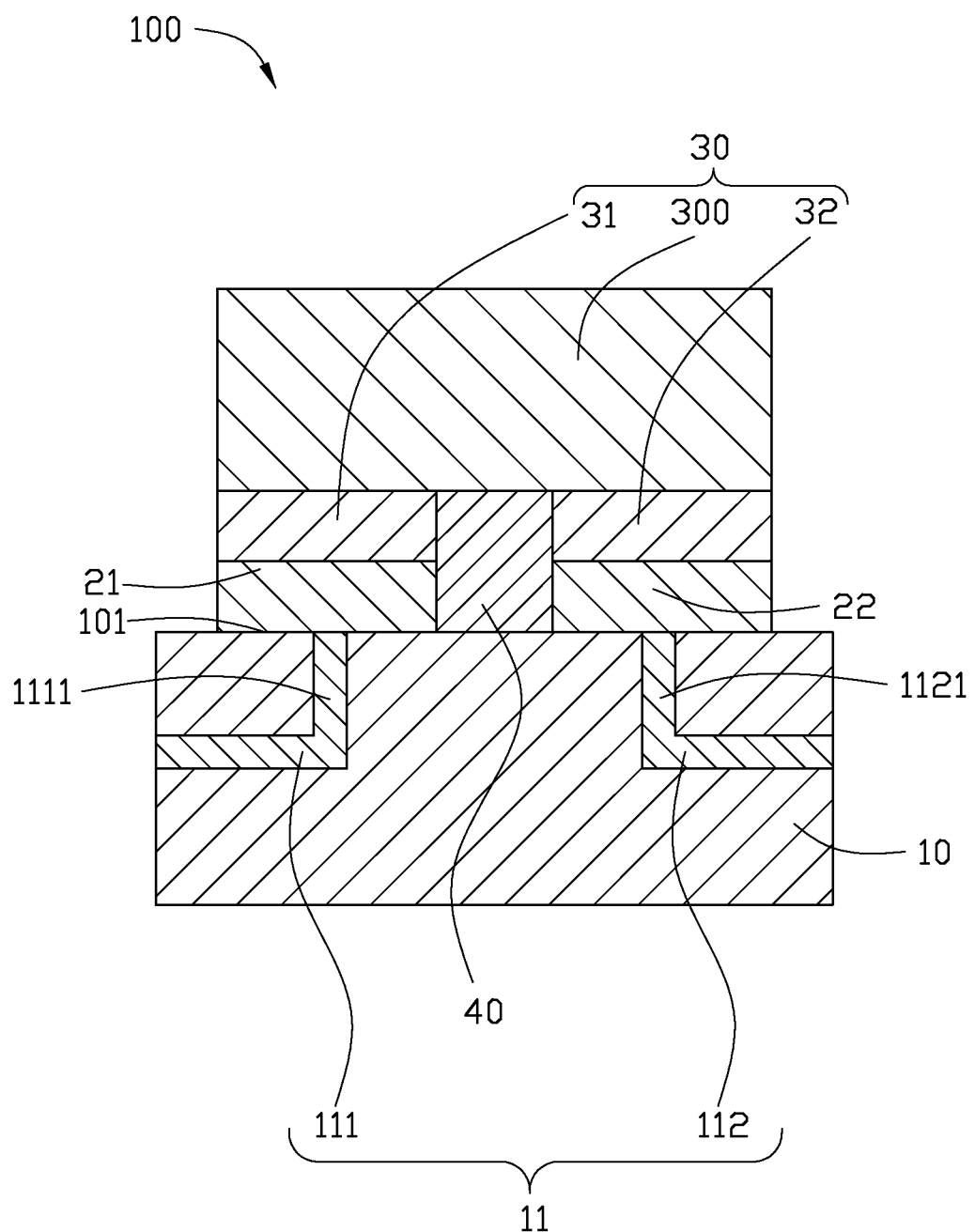
FIG. 5 is a cross sectional view showing a semi-finished light emitting diode module processed by "providing a light emitting diode die, the light emitting diode die being formed on the block" of a method of manufacturing a light emitting diode module in accordance with an embodiment of the present disclosure.

A light emitting diode die 30 is provided, and formed on the block 40, illustrated in FIG. 5. The light emitting diode die 30 includes a first electrode 31 and a second electrode 32. The block 40 is positioned between the first electrode 31 and the second electrode 32. The first electrode 31 and the second electrode 32 are respectively electrically connected with the first soldering section 21 and the second soldering section 22.

The circuit structure 11 includes a first connecting element 111 and a second connecting element 112. The first connecting element 111 and the second connecting element 112 insulates with each other. Both of the first connecting element 111 and the second connecting element 112 are hided in the substrate 10. The first connecting element 111 defines a first extending portion 1111. The first extending portion 1111 extends to and exposes on the top surface 101 of the substrate 10. The second connecting element 112 defines a second extending portion 1121. The second extending portion 1121 extends to and exposes on the top surface 101 of the substrate 10. The substrate 10 can be made of a heat conduction material.

The block 40 can be made of carbon oxide. In at least one embodiment, the block 40 can be made of epoxy resin. In at least one embodiment, the height of the block 40 can be larger than or equal to 5 micrometers.

The first soldering section 21 and the second soldering section 22 are spaced from each other. In at least one embodiment, the first soldering section 21 can be electrically connected to the first extending portion 1111, and the second soldering section 22 can be electrically connected to the second extending portion 1121. The first soldering section 21 and the second soldering section 22 are made of a die attaching material.

The light emitting diode die 30 further include a main body 300. The main body 300 can include an N-type semiconductor layer, an active layer and a P-type semiconductor layer (not shown). The main body 300 can further include other structures (not shown), such as an insulating structure. The insulating structure can include a plurality of through holes. A conductive material can fill in the through holes to make the N-type semiconductor layer and the P-type semiconductor layer to be electrically connected the first electrode 31 and the second electrode 32. The insulating structure can avoid a shout circuit generated between the N-type semiconductor layer and the P-type semiconductor layer. The conductive material can be made of nickel, silver, platinum, chromium, gold or other alloy materials. The first electrode 31 and the second electrode 32 are spaced from each other. The first electrode 31 faces the first soldering section 21, and the second electrode 32 faces the second soldering section 22.

The embodiments shown and described above are only examples. Many details are often found in the art such as the other features of a light emitting diode module and a method of manufacturing the light emitting diode module. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode module comprising:
    a substrate having a top surface and comprising a circuit structure, the top surface being a plane;
    the top surface forming a block;
    the top surface of the substrate forming a first soldering section and a second soldering section and being electrically connected with the circuit structure;
    the top surface forming a block being positioned between the first soldering section and the second solder section and having a height that is greater than a thicknesses of the first soldering section and the second soldering section; and
    a light emitting diode die comprising a first electrode and a second electrode, the first electrode and the second electrode, respectively, being directly electrically connected to the first soldering section and the second soldering section;
    wherein the circuit structure comprises a first connecting element and a second connecting element, the first connecting element and the second connecting element are insulated from each other;
    wherein both of the first connecting element and the second connecting element are formed and embedded in the substrate;
    wherein the first connecting element comprises a first extending portion, and the first extending portion extends to and exposes on the top surface of the substrate, the second connecting element comprises a second extending portion, and the second extending portion extends to and exposes on the top surface of the substrate;
    wherein the first soldering section is electrically connected to the first extending portion, and the second soldering section is electrically connected to the second extending portion; and
    wherein the first soldering section contacts with and covers an exposed end of the first extending portion, and the second soldering section contacts with and covers an exposed end of the second extending portion.

2. A method of manufacturing a light emitting diode module, comprising:
    providing a substrate having a top surface and comprising a circuit structure, the top surface being a plane;
    forming a block on the top surface of the substrate;
    forming a first soldering section and a second soldering section on the top surface of the substrate, the first soldering section and the second soldering section being connected to the circuit structure, the block being positioned between the first soldering section and the second soldering section, a height of the block being larger than thicknesses of the first soldering section and the second soldering section; and providing a light emitting diode die on the block, the light emitting diode die comprising a first electrode and a second electrode, the block being positioned between the first electrode and the second electrode, the first electrode and the second electrode being respectively electrically connected with the first soldering section and the second soldering section;

wherein the circuit structure comprises a first connecting element and a second connecting element, the first connecting element and the second connecting element are insulated from each other;

wherein both of the first connecting element and the second connecting element are formed and embedded in the substrate;

wherein the first connecting element comprises a first extending portion, and the first extending portion extends to and exposes on the top surface of the substrate, and the second connecting element defines a second extending portion, and the second extending portion extends to and exposes on the top surface of the substrate;

wherein the first soldering section is electrically connected to the first extending portion, and the second soldering section is electrically connected to the second extending portion; and wherein the first soldering section contacts with and covers an exposed end of the first extending portion, and the second soldering section contacts with and covers an exposed end of the second extending portion.

3. The light emitting diode module of claim 1, wherein the first connecting element further defines a first horizontal extending portion, the second connecting element further defines a second horizontal extending portion, the first and second horizontal portions extends towards opposite directions.

4. The method of claim 2, wherein the first connecting element further defines a first horizontal extending portion, the second connecting element further defines a second horizontal extending portion, the first and second horizontal portions extends towards opposite directions.

* * * * *